(12) United States Patent
Huang et al.

(10) Patent No.: US 6,306,682 B1
(45) Date of Patent: Oct. 23, 2001

(54) METHOD OF FABRICATING A BALL GRID ARRAY INTEGRATED CIRCUIT PACKAGE HAVING AN ENCAPSULATING BODY

(75) Inventors: Chien-Ping Huang, Hsinchu Hsien; Randy H. Y. Lo, Taipei; Tzong-Da Ho, Taichung; Eric Ko, Taichung Hsien; Jui-Meng Jao, Miaoli, all of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/547,157

(22) Filed: Apr. 11, 2000

(30) Foreign Application Priority Data

May 31, 1999 (TW) ............................................ 88108943 A

(51) Int. Cl.⁷ ............................ H01L 21/44; H01L 21/48; H01L 21/50
(52) U.S. Cl. ........................... 438/107; 438/118; 438/618
(58) Field of Search ................................. 438/107, 108, 438/612, 613, 614, 615, 616, 617, 618

(56) References Cited

U.S. PATENT DOCUMENTS

| | | | |
|---|---|---|---|
| 5,830,800 | 11/1998 | Lin | 438/459 |
| 6,077,766 * | 6/2000 | Sebesta et al. | 438/618 |
| 6,232,661 * | 5/2001 | Amagai et al. | 257/737 |

* cited by examiner

*Primary Examiner*—David Nelms
*Assistant Examiner*—Phuc T. Dang
(74) *Attorney, Agent, or Firm*—Peter F. Corless; Edwards & Angell, LLP

(57) ABSTRACT

A method of fabricating a BGA (Ball Grid Array) IC package of the type having an encapsulating body is proposed, which allows the BGA IC package to be manufactured without having to use conventional organic substrate and encapsulating-body mold having cavity, so that the manufacture process can be more cost-effective to carry out than the prior art. The proposed method is characterized in the use of a copper piece which is selectively removed to form an encapsulating-body cavity for the forming of an encapsulating body therein. The proposed method requires no use of mold with cavity for the forming of the encapsulating body, allowing the same mold to be used for the fabrication of various BGA IC packages of different sizes. Moreover, the proposed method allows fan-in design as well as fan-out design, thus allowing the number of I/O ports to be increased while making the overall package configuration compact in size, and also allows the implantation of the electrically-conductive balls to be easier to carry out and more precisely controlled than the prior art, making the ball implantation more assured in quality than the prior art. Therefore, the proposed method is more advantageous and cost-effective to use than the prior art.

14 Claims, 3 Drawing Sheets

US 6,306,682 B1

METHOD OF FABRICATING A BALL GRID ARRAY INTEGRATED CIRCUIT PACKAGE HAVING AN ENCAPSULATING BODY

BACKGROUND OF THE INVENTION

1. Field of the Invention

This invention relates to integrated circuit (IC) packaging technology, and more particularly, to a method of fabricating a BGA (Ball Grid Array) IC package of the type having an encapsulating body, which allows the BGA IC package to be manufactured without having to use conventional organic substrate and encapsulating-body mold having cavity, so that the manufacture process can be more cost-effective to carry out than the prior art.

2. Description of Related Art

The BGA IC packaging technology allows an IC package to be made very small in size while nevertheless providing highly integrated functionality from a single IC package. A conventional method for fabricating a BGA IC package of the type having an encapsulating body is disclosed in U.S. Pat. No. 5,830,800, whose procedural steps are briefly depicted in the following with reference to FIGS. 1A–1F.

Referring to FIG. 1A, in the first step, a copper sheet 10 is prepared. Next, a dry film 20 of a predetermined pattern is formed over the copper sheet 10. The dry film 20 can be formed by, for example, first coating a photoresist layer over the copper sheet 10, and then removing selected portions of the photoresist layer through a masked exposure/development/etching process.

Referring to FIG. 1B, in the next step, an electrically-conductive material is coated over those areas over the copper sheet 10 that are unmasked by the dry film 20 to thereby form an electrically-conductive trace structure 30 over the copper sheet 10. After this, the entire dry film 20 (FIG. 1A) is removed. Subsequently, an IC chip 40 is mounted over the electrically-conductive trace structure 30.

Referring to FIG. 1C, in the next step, a wire-bonding process is performed to apply a set of bonding wires 50 for electrically coupling the IC chip 40 to corresponding I/O ports on the electrically-conductive trace structure 30.

Referring to FIG. 1D, in the next step, an encapsulating body 60 is formed to encapsulate the IC chip 40, the bonding wires 50, and the electrically-conductive trace structure 30.

Referring to FIG. 1E, in the next step, the copper sheet 10 is removed through an etching process. After the copper sheet 10 is removed, the bottom side of the electrically-conductive trace structure 30 is exposed.

Referring to FIG. 1F, in the next step, an anti-oxidation coating 70 is formed over the bottom side of the encapsulating body 60, while uncovering the electrically-conductive trace structure 30. After this, a plurality of solder balls 80 are bonded to corresponding points on the electrically-conductive trace structure 30. This completes the BGA IC package fabrication.

The foregoing patented method has the benefit of allowing the overall manufacture process to be simplified without having to use thick organic substrate, so that is highly cost-effective to carry out. For this reason, it is suitable for use to manufacture those IC packages that are to be mounted on small computers and intelligent electronic devices, such as palmtop computers and mobile phones.

One drawback to the forgoing patented method, however, is that it is only suitable for fan-out design, making the overall size difficult to be further reduced. This is because that the electrically-conductive trace structure 30 can be formed only beyond, and not within, the junction region of the IC chip 40, making the surface area of the overall package body quite large. Still one drawback is that the etching process required to remove the copper sheet 10, if not precisely controlled, would easily cause surface damage to the bottom side of the electrically-conductive trace structure 30 and the encapsulating body 60, which would undesirably degrade the quality of the resulted BGA IC package. Moreover, after the copper sheet 10 is removed, the bottom side of the semi-finished package configuration is only supported by the electrically-conductive trace structure 30, which is considered weak, thus making the positioning of the solder balls on the electrically-conductive trace structure 30 quite difficult to carry out.

SUMMARY OF THE INVENTION

It is therefore an objective of this invention to provide a new method for fabricating a BGA IC package, which allows the forming of the encapsulating body to be carried out though the use of a mold with no cavity, so that the same mold can be used for the fabrication of various BGA IC packages of different sizes, so that equipment cost can be reduced to help save the overall manufacture process.

It is another objective of this invention to provide a new method for fabricating a BGA IC package, which requires no conventional organic substrate so that the manufacture process can be carried out more cost-effectively and the resulted BGA IC package can be made more compact in size than the prior art.

It is still another objective of this invention to provide a new method for fabricating a BGA IC package, which allows fan-in design as well as fan-out design so that the number of I/O ports can be increased while making the overall package configuration compact in size.

It is yet another objective of this invention to provide a new method for fabricating a BGA IC package, which requires no etching process to be performed after the encapsulating body is formed so that the finished package can be more assured in quality than the prior art.

It is still yet another objective of this invention to provide a new method for fabricating a BGA IC package, which allows the implantation of the electrically-conductive balls to be easier to carry out and more precisely controlled than the prior art so that the implantation of the electrically-conductive balls can be more assured in quality than the prior art.

In accordance with the foregoing and other objectives, the invention proposes a new method for fabricating a BGA IC package. The method of the invention comprises the following procedural steps: (1) preparing a copper piece having a first surface coated with a first photoresist layer and a second surface coated with a second photoresist layer; (2) performing a selective-removal process on the second photoresist layer; (3) coating an electrically-conductive material over those areas over the second surface of the copper piece that are unmasked by the remaining part of the second photoresist layer to thereby form an electrically-conductive trace structure; (4) removing all the remaining parts of the first and second photoresist layers; (5) coating a first solder mask over the first surface of the copper piece and a second solder mask over the second surface of the copper piece; (6) defining a plurality of solder-ball openings in the second solder mask and an encapsulating-body opening in the first solder mask; (7) with the first solder mask serving as mask, removing the unmasked part of the copper piece through the encapsulating-body opening until reaching the electrically-conductive trace structure on the opposite side of the copper piece to thereby form an encapsulating-body cavity in the copper piece; (8) mounting at least one IC chip within the encapsulating-body cavity and over the electrically-conductive trace structure and the second solder mask; (9) electrically coupling the IC chip to corresponding points on the electrically-conductive trace structure; (10) forming an encapsulating body in the combined hollow space of the encapsulating-body cavity and the encapsulating-body opening; (11) implanting a plurality of electrically-conductive balls in the solder-ball openings; and (12) cutting away the remaining parts of the copper piece.

The foregoing method of the invention is characterized in that it requires no use of conventional organic substrate and no use of mold with cavity to manufacture the BGA IC package, which allows the overall manufacture process to be easier and cost-effective to carry out, and also allows the manufactured BGA IC package to be more assured in quality. The method of the invention is therefore more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
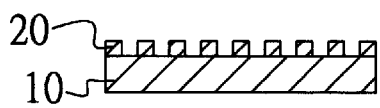
FIGS. 1A–1F (PRIOR ART) are schematic sectional diagrams used to depict the procedural steps involved in a conventional method (U.S. Pat. No. 5,830,800) for fabricating a BGA IC package.
Figure 1B:
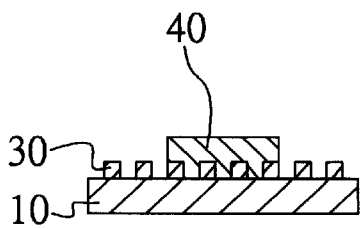
Figure 1C:
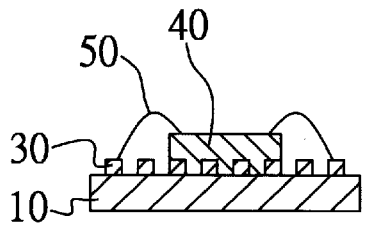
Figure 1D:
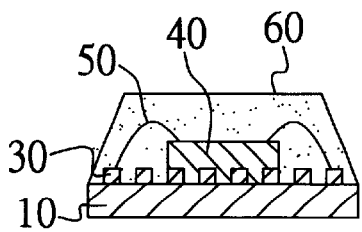
Figure 1E:
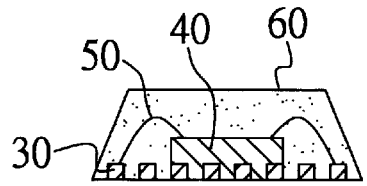
Figure 1F:
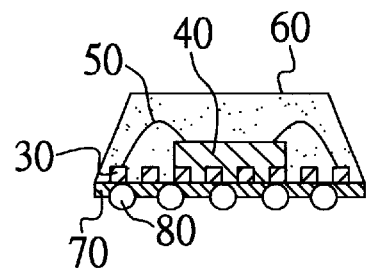
Figure 2A:
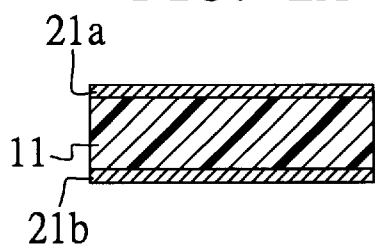
FIGS. 2A–2K are schematic sectional diagrams used to depict the procedural steps involved in the method of the invention for fabricating a BGA IC package.

FIGS. 2A–2K are schematic sectional diagrams used to depict the procedural steps involved in the method of the invention for fabricating a BGA IC package. Referring to FIG. 2A, in the first step, a copper piece 11 is prepared, which is coated with a first photoresist layer 21a over the top surface thereof and a second photoresist layer 21b over the bottom surface thereof. The two photoresist layers 21a, 21b can be formed from liquid photoresist or each a dry-photoresist film.

Figure 2B:
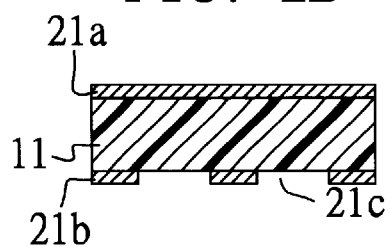

Referring to FIG. 2B, in the next step, the second photoresist layer 21b is selectively removed through a masked exposure/development/etching process (the remaining portions thereof are here designated by the reference numeral 21c).

Figure 2C:
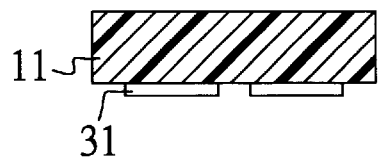

Referring to FIG. 2C, in the next step, an electrically-conductive material, which is preferably gold, tin, or palladium, is coated over those areas on the bottom side of the copper piece 11 that are unmasked by the remaining portions 21c of the second photoresist layer 21b to thereby form an electrically-conductive trace structure 31. After this, the two photoresist layers 21a, 21b are entirely removed.

Figure 2D:
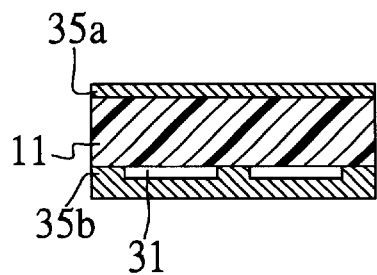

Referring to FIG. 2D, in the next step, a first solder mask 35a is coated over the top surface of the copper piece 11, while a second solder mask 35b is coated over the bottom surface of the same. These two solder masks 35a, 35b are preferably formed from polyimide.

Figure 2E:
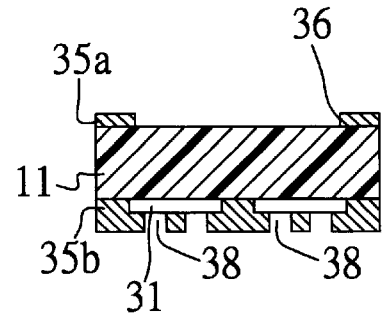

Referring to FIG. 2E, in the next step, the second solder mask 35b is selectively removed through a masked exposure/development/etching process to thereby define a plurality of solder-ball openings 38 to expose selected points on the electrically-conductive trace structure 31 (the solder-ball openings 38 are so named because they will be later used for the mounting of a plurality of solder balls therein); while the first solder mask 35a is also selectively removed in such a manner as to define an encapsulating-body opening 36 (the encapsulating-body opening 36 is so named because it will be later used for forming the encapsulating body of the BGA IC package).

Figure 2F:
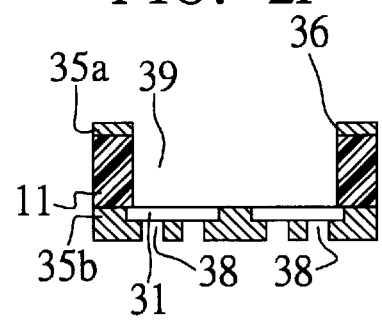

Referring to FIG. 2F, in the next step, with the remaining part of the first solder mask 35a serving as mask, an etching process is perform to remove the unmasked part of the copper piece 11 until reaching the electrically-conductive trace structure 31 originally formed over the bottom surface of the copper piece 11. As a result of this process, an encapsulating-body cavity 39 is formed in the copper piece 11 (the encapsulating-body cavity 39 is so named because it will be later used to form the encapsulating body of the BGA IC package therein).

Figure 2G:
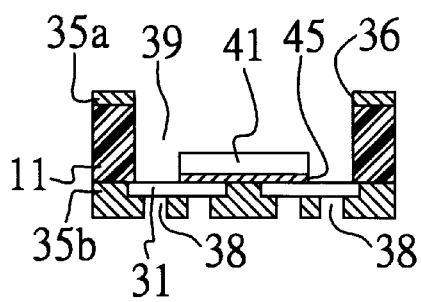

Referring to FIG. 2G, in the next step, an IC chip 41 is mounted within the encapsulating-body cavity 39 and over the electrically-conductive trace structure 31 and the second solder mask 35b by means of an electrically-insulative adhesive 45.

Figure 2H:
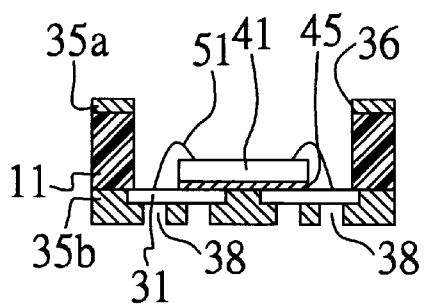

Referring to FIG. 2H, in the next step, a wire-bonding process is performed to apply a set of bonding wires 51 to electrically couple the IC chip 41 to corresponding points on the electrically-conductive trace structure 31. Alternatively, the electrically coupling of the IC chip 41 to the electrically-conductive trace structure 31 can be carried out through the flip-chip technology.

Figure 2I:
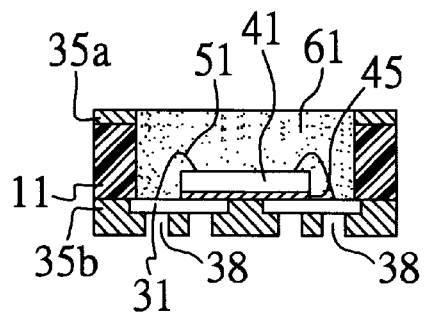

Referring to FIG. 2I, in the next step, an encapsulating material is filled into the encapsulating-body cavity 39 so as to form an encapsulating body 61 to encapsulate the IC chip 41 and the bonding wires 51. It is a characteristic feature of the invention that, since the encapsulating-body cavity 39 and the encapsulating-body opening 36 are used in combination to define the void space where the encapsulating body 61 is formed, the mold used in this process can be formed with no cavity, which allows the same mold to be used for the fabrication of various BGA IC packages of different sizes. Compared to the prior art, the invention is undoubtedly more cost-effective to carry out than the prior art.

Figure 2J:
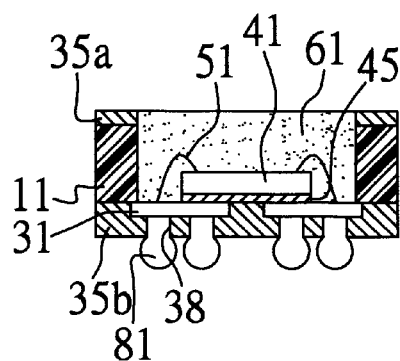

Referring to FIG. 2J, in the next step, a plurality of electrically-conductive balls 81, such as tin balls or gold balls, are implanted into the solder-ball openings 38 in the second solder mask 35b. These electrically-conductive balls 81 will be later used to mount the entire BGA IC package on a printed circuit board (not shown) through the surface-mount technology (SMT).

Figure 2K:
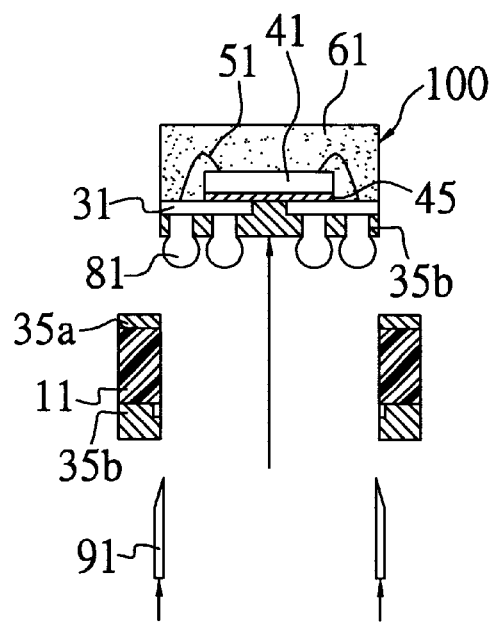

Referring to FIG. 2K, in the final step, cutting means 91 is used to cut away all the remaining portions of the copper piece 11 together with the overlying part of the first solder mask 35a and the underlying part of the second solder mask 35b. The remaining part then serves as the intended BGA IC package. This completes the BGA IC package fabrication.

In conclusion, the invention provides a method for fabricating a BGA IC package, which has the following advantages over the prior art.

First, the method of the invention allows the use of no conventional organic substrate, which is considerably thick and complex in structure, thus allowing the manufacture process to be more cost-effective to carry out and the resulted BGA IC package to be more compact in size than the prior art.

Second, since the method of the invention allows the forming of an electrically-conductive trace structure over the projected area beneath the IC chip, it allows fan-in design as well as fan-out design, thus allowing the number of I/O ports to be increased while making the overall package configuration compact in size.

Third, the method of the invention requires no etching process to be performed after the encapsulating body is formed, thus allowing the finished package to be more assured in quality than the prior art.

Fourth, the method of the invention allows the implantation of the electrically-conductive balls to be easier to carry out and more precisely controlled than the prior art due to the fact that the copper piece can provide firm support. The implantation of the electrically-conductive balls is therefore more assured in quality than the prior art.

Fifth, the method of the invention allows the forming of the encapsulating body to be carried out though the use of a mold with no cavity, so that the same mold can be used in the manufacture of different BGA IC package sizes. This benefit can help save equipment cost, making the overall manufacture process significantly more cost-effective to carry out than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a BGA IC package, comprising the steps of:

(1) preparing a copper piece having a first surface coated with a first photoresist layer and a second surface coated with a second photoresist layer, (2) performing a selective-removal process on the second photoresist layer;

(3) coating an electrically-conductive material over those areas over the second surface of the copper piece that are unmasked by the remaining part of the second photoresist layer to thereby form an electrically-conductive trace structure;

(4) removing all the remaining parts of the first and second photoresist layers;

(5) coating a first solder mask over the first surface of the copper piece and a second solder mask over the second surface of the copper piece;

(6) defining a plurality of solder-ball openings in the second solder mask and an encapsulating-body opening in the first solder mask, (7) with the first solder mask serving as mask, removing the unmasked part of the copper piece through the encapsulating-body opening until reaching the electrically-conductive trace structure on the opposite side of the copper piece to thereby form an encapsulating-body cavity in the copper piece;

(8) mounting at least one IC chip within the encapsulating-body cavity and over the electrically-conductive trace structure and the second solder mask;

(9) electrically coupling the IC chip to corresponding points on the electrically-conductive trace structure;

(10) forming an encapsulating body in the combined hollow space of the encapsulating-body cavity and the encapsulating-body opening;

(11) implanting a plurality of electrically-conductive balls in the solder-ball openings; and

(12) cutting away the remaining parts of the copper piece.

2. The method of claim 1, wherein in said step (2), the selective-removal process for the second photoresist layer comprises a masked exposure/development/etching process.

3. The method of claim 1, wherein in said step (3), the electrically-conductive material is selected from the group comprising gold, tin, and palladium.

4. The method of claim 1, wherein in said step (11), the electrically-conductive balls are formed from an electrically-conductive material selected from the group comprising tin and gold.

5. The method of claim 1, wherein in said step (6), the encapsulating-body opening in the first solder mask is formed through a masked exposure/development/etching process.

6. The method of claim 1, wherein in said step (8), the IC chip is mounted over the electrically-conductive trace structure and the second solder mask by means of an electrically-insulative adhesive.

7. The method of claim 1, wherein in said step (9), the electrically coupling of the IC chip to corresponding points on the electrically-conductive trace structure is carried out through a wire-bonding process.

8. The method of claim 1, wherein in said step (7), the removal of the unmasked part of the copper piece to form the encapsulating-body cavity in the copper piece is performed through an etching process.

9. The method of claim 1, wherein in said step (1), the photoresist layers are formed from liquid photoresist.

10. The method of claim 1, wherein in said step (1), the photoresist layers are each a dry-photoresist film.

11. The method of claim 1, wherein in said step (9), the IC chip is electrically coupled to corresponding points on the electrically-conductive trace structure through the flip-chip technology.

12. The method of claim 1, wherein in said step (10), a mold with no cavity is used to form the encapsulating body.

13. The method of claim 1, wherein in said step (5), the first and second solder masks are formed from a solder-repellant agent.

14. The method of claim 1, wherein in said step (5), the first and second solder masks are formed from polyimide.

* * * * *